(12) United States Patent
Ketonen

(10) Patent No.: US 12,453,010 B2
(45) Date of Patent: Oct. 21, 2025

(54) INFLEXIBLE VOLTAGE REFERENCE CIRCUIT CARD, AND METHOD FOR MANUFACTURING AN INFLEXIBLE VOLTAGE REFERENCE CIRCUIT CARD

(71) Applicant: BEAMEX OY AB, Pietarsaari (FI)

(72) Inventor: Hannu Ketonen, Pietarsaari (FI)

(73) Assignee: BEAMEX OY AB, Pietarsaari (FI)

( * ) Notice: Subject to any disclaimer, the term of this patent is extended or adjusted under 35 U.S.C. 154(b) by 151 days.

(21) Appl. No.: 18/391,134

(22) Filed: Dec. 20, 2023

(65) Prior Publication Data
US 2024/0215166 A1    Jun. 27, 2024

(30) Foreign Application Priority Data
Dec. 21, 2022    (FI) ...................................... 20226145

(51) Int. Cl.
| | |
|---|---|
| H05K 1/14 | (2006.01) |
| H05K 1/11 | (2006.01) |
| H05K 3/36 | (2006.01) |
| H05K 3/46 | (2006.01) |

(52) U.S. Cl.
CPC ............. *H05K 1/147* (2013.01); *H05K 1/118* (2013.01); *H05K 3/363* (2013.01); *H05K 3/4691* (2013.01)

(58) Field of Classification Search
CPC ........ H05K 1/147; H05K 1/118; H05K 3/363; H05K 3/4691
USPC ....................................................... 361/749
See application file for complete search history.

(56) References Cited

U.S. PATENT DOCUMENTS

| | | | |
|---|---|---|---|
| 4,377,316 | A | 3/1983 | Ecker |
| 11,184,981 | B2 | 11/2021 | Williams |
| 2014/0125301 | A1 | 5/2014 | Handford |
| 2015/0185087 | A1 | 7/2015 | Ogoshi |
| 2016/0374200 | A1 | 12/2016 | Lee |
| 2017/0118838 | A1 | 4/2017 | Williams |

(Continued)

FOREIGN PATENT DOCUMENTS

| | | |
|---|---|---|
| CN | 104199509 A | 12/2014 |
| DE | 102013216493 A1 | 2/2015 |

(Continued)

OTHER PUBLICATIONS

Texas Instruments, "Low-Voltage Adjustable Precision Shunt Regulators", Sep. 1, 2009, 47 pgs.

(Continued)

*Primary Examiner* — Binh B Tran
(74) *Attorney, Agent, or Firm* — Merchant & Gould P.C.

(57) ABSTRACT

Voltage reference circuits may be sensitive to thermal changes in their surroundings and to effects made by humidity, and external forces, vibrations, and other effects. A rigid planar circuit structure has a voltage reference circuit on either side and a temperature sensor on another side of the rigid circuit board. The arrangement includes two flexible connectors, such as flexible circuit boards or flexible flat cables. These can be relatively short in their length. Ceramic materials can be used as a base material in the rigid circuit board, such as alumina. The arrangement enables obtaining accurate outputs from the voltage reference circuit because notable thermal gradients will not be present around sensitive parts of the circuitry.

16 Claims, 2 Drawing Sheets

(56) References Cited

U.S. PATENT DOCUMENTS

2021/0343690 A1* 11/2021 Salmon .............. H05K 7/20463

FOREIGN PATENT DOCUMENTS

| EP | 3664585 A1 | 6/2020 |
|---|---|---|
| WO | 2021090065 A2 | 5/2021 |

OTHER PUBLICATIONS

European Search Report received for EP Serial No. 23218568.6 on Jun. 3, 2024, 8 pgs.
Finnish Search Report received for FI Application No. 20226145 on Jun. 22, 2023, 3 pgs.
Liu, Chih-Peng, et al., "A CMOS Voltage Reference with Temperature Sensor Using Self-PTAT Current Composition", Robotics Laboratory, Department of Mechanical Engineering, National Taiwan University, 2005, 4 pgs.
Chang, Ming-Hui, et al., "Chip Implementation with a Combined Wireless Temperature Sensor and reference Devices Based on the DZTC Principle", Department of Mechanical Engineering, National Taiwan University, Oct. 31, 2011, 18 pgs.
Meijer, Gerard C.M., et al., "Temperature Sensors and Voltage References Implemented in CMOS Technology", IEEE Sensors Journal, vol. 1, No. 3, Oct. 2001, 10 pgs.

* cited by examiner

INFLEXIBLE VOLTAGE REFERENCE CIRCUIT CARD, AND METHOD FOR MANUFACTURING AN INFLEXIBLE VOLTAGE REFERENCE CIRCUIT CARD

CROSS-REFERENCE TO RELATED APPLICATIONS

The present application claims priority to Finnish Patent Application No. 20226145 filed on Dec. 21, 2022, which application is incorporated herein by reference in its entirety.

TECHNICAL FIELD

The present invention is related to accurate voltage references, and circuit cards providing accurate voltage references.

The present invention is related to accurate voltage references, and circuit cards providing accurate voltage references. The present invention is further related especially to circuit cards that are used in end devices applied in a field environment, where environmental conditions like e.g. temperature and humidity may vary a lot compared to controlled laboratory or office environments.

BACKGROUND

Voltage reference is a device which produces a fixed and accurately definable voltage, no matter of the loading of the device, or power supply variations or changes in temperature or the passage of time. There are many application areas, such as power supplies, A/D or D/A converters, and other measurement and control systems.

The voltage reference must be accurate, but the required precision depends on the used application. Furthermore, the voltage reference circuits are very sensitive to external effects, such as mechanical impacts comprising blunt forces and vibrations, for instance. The voltage reference circuits are also sensitive to material-transformative effects made by changing temperatures or very high temperatures. Very humid conditions or changing humidity characteristics in general may also generate harmful effects on sensitive voltage reference circuits.

For the purposes of making a reliable measurement circuit or connection enabling a particular measurement to be performed (involving some electrical components), a voltage reference circuit is one of the most relevant and important components, if not the most important one. Because the voltage reference circuit is easily affected by the above various external environmental effects, the functionality of the whole measurement circuit and the accuracy of its results could be easily tampered.

This technical problem is taken into consideration in the following, and in the presented solution according to the present invention.

Concerning prior art solutions, U.S. Pat. No. 11,184,981 ("Williams") presents a rigid-flex printed circuit board (PCB) which includes an array of rigid PCB "islands" interconnected by a flexible PCB formed into flexible connectors. Especially FIGS. 11-13 illustrate certain embodiments of Williams. This reference thus presents a combination of flat cablings and rigid circuit parts. Williams also mentions a reference voltage and a temperature sensor.

"Temperature Sensors and Voltage References Implemented in CMOS Technology", IEEE Sensors Journal, Vol. 1, No. 3, October 2001 ("Meijer") presents certain concepts, opportunities and limitations of temperature sensors and voltage references applying CMOS technology. Meijer mentions that effects of mechanical stress are a major source of inaccuracy, but with the CMOS technology, those effects remain rather minor. Meijer concludes that accurate voltage references can be realized with the presented CMOS-based technology.

"A CMOS Voltage Reference with Temperature Sensor using Self-PTAT Current Compensation", IEEE, SOC Conference, October 2005 ("Liu") presents a CMOS circuit which has a combined voltage reference circuit and a temperature sensor. Liu presents a circuit topology (and calculation logic for the values) which is used to create a voltage reference whose output voltage is not dependent on the temperature, nor the supply voltage of the circuit. Additionally, Liu presents a temperature sensor which works in a very linear fashion. Liu does not discuss issues concerning prevention of the mechanical stress or forces for the discussed circuit.

"Chip Implementation with a Combined Wireless Temperature Sensor and Reference Devices Based on the DZTC Principle", Sensors 2011, 11, 10308-10325, 31 Oct. 2011 ("Chang") presents a temperature sensor structure manufactured with the CMOS process, where the circuit structure also involves two voltage references and one current reference. The core of reference Chang is however the manufacturing of an accurate and wireless temperature sensor with the CMOS technique, and not any manufacturing of a voltage reference circuit.

CN 104199509A ("Zhou") discloses a temperature compensating circuit for bandgap reference. Zhou's purpose is to enhance the accuracy of the voltage reference circuit for the whole desired temperature range by manufacturing a temperature compensation circuit. This circuit is based on the transconductance amplifier, that is, a voltage-controlled current source.

One way of stabilizing the surrounding temperatures around the circuit board comprising the voltage reference circuit is to place the circuit board in "an oven structure". The oven structure may be a closable or partly closable block-type of entity comprising a free volume inside it for the temperature-controlled elements (such as circuit boards, devices, or sensors) and allowing heating or cooling of such a volume. This "oven" with the temperature within that "free inner volume" can be controlled (i.e. either kept at a certain temperature, or changed to another temperature value, where the latter makes the temperature-controlled physical entity to also either heat or cool towards the ambient temperature within that volume). Heating elements and a cooling functionality (e.g. a fan) may implement the temperature control in practice. This means that when placing an electronic circuitry comprising a voltage reference circuit as the temperature controlled physical entity, the temperature of the voltage reference circuit itself can also be stabilized rather precisely to a predetermined temperature value. A drawback of this oven-based system is the lack of easy portability for such a robust system, and furthermore, the oven-based system requires an electrical supply in order to work, and this need is continuous. Thus, it is not practical, nor the most ecological arrangement either. This is a major drawback of the oven-based system.

One known way of coping with the thermal expansions and retractions of materials and in such a way created tensions between different material interfaces, is using millings along the circuit board. This is useful for larger planar areas of a base material for the electrical circuitry with the required components, where the tension-like forces could accumulate from larger surfaces and propagate along it to cause harmful effects. For instance, a sensitive section of the electronic circuitry may locate in the middle of the circuit board, and this central part may be milled or carved to be separated from the rest of the circuit board; except for short "isthmus-type" of connections (there can be one, two or several of such connecting sections) keeping the central part still fixed to the rest of the circuit board. In this way, the external forces and tensions will "die out" or at least mitigate notably when they reach the carved gaps. This method is not perfect because the "isthmus-type" of connecting sections will still act as a physical path for the external tensions and forces towards the sensitive part of the electronic circuitry. In order to avoid this, the circuit section with the sensitive parts should be a completely floating structure, but that is very hard to implement in practice, noting the required connections and supporting substrate sections which are in any way required. The milling technique has a drawback where different parts of the circuit board may twist in relation to one another, because the carved gaps make it possible for the surface sections to move or twist in relation to one another more easily.

In soldering, there may be a problem with humidity; as the moisture exits the structure involving soldered sections, it results in changes in the physical structure which creates also harmful electrical effects there. So-called soldering voltages may create a problem in this sense.

Concerning the above discussed prior art, there still remains a problem that when temperature changes to a larger extent or rate, a notable mechanical stress will affect the voltage reference circuit board and make it inaccurate. Humidity, too, creates mechanical stress to the voltage reference circuit board. The system should remain practical as well for the end user, and it should not consume excessive electrical energy, too.

The present invention proceeds into solving these technical problems.

SUMMARY

The present invention introduces a circuit board arrangement which comprises a voltage reference circuit or a voltage reference output, which circuit board arrangement enables mitigating the effects of changing temperatures or greater humidity within the circuitry and the circuit board. Thus, the arrangement involving the accurate voltage reference functionality will remain accurate even in more challenging thermal and humidity conditions. As a practical result, there would not be any notable temperature gradients within the area and within close vicinity of the voltage reference circuit, even in the case when there exist notable thermal changes in the surrounding environment of the circuitry.

According to a first aspect of the present invention, there is introduced a circuit board arrangement (10), which circuit board arrangement (10) comprises:
 a first planar side of a rigid circuit board (11) comprising a voltage reference circuit (12).

The circuit board arrangement (10) is characterized in that the circuit board arrangement (10) further comprises:
 a second planar side of the rigid circuit board (11) comprising a temperature sensor (13), wherein the first and second planar sides locate on opposite surfaces of the rigid circuit board (11), wherein the circuit board arrangement (10) further comprises:
 a first flexible circuit board (14) and a second flexible circuit board (15) connected to opposite edges of the rigid circuit board (11), respectively, with electrical connections between the rigid circuit board (11) and the respective flexible circuit board (14, 15), allowing electrical connections of the voltage reference circuit (12) to a desired electronic circuitry.

In an embodiment according to the first aspect of the invention, the rigid circuit board (11) comprises a ceramic material or a mixture of ceramic materials as its base material, wherein the ceramic materials are selected from a group of $Al_2O_3$ (alumina), SiC, BeO, AlN (aluminum nitride), $Si_3N_4$ (silicon nitride) and hybrid materials.

In an embodiment according to the first aspect of the invention, the first and second flexible circuit boards (14, 15) have lengths in the range of 5-15 mm.

In an embodiment according to the first aspect of the invention, the first and second flexible circuit boards (14, 15) are configured to be fixed to the rigid circuit board (11) by soldering.

In an embodiment according to the first aspect of the invention, mixing ratios of ingredients, which comprise a solder material, are configured to be adjusted.

In an embodiment according to the first aspect of the invention, the first flexible circuit board (14) and the second flexible circuit board (15) are both flexible flat cables.

According to a second aspect of the present invention, there is introduced a method for manufacturing a circuit board arrangement (10), which is characterized in that the method for manufacturing comprises the steps of:
 manufacturing a rigid circuit board (11), which comprises a voltage reference circuit (12) on a first planar side of the rigid circuit board (11), and a temperature sensor (13) on a second planar side of the rigid circuit board (11), wherein the first and second planar sides locate on opposite surfaces of the rigid circuit board (11);
 installing a first flexible circuit board (14) and a second flexible circuit board (15) connected to opposite edges of the rigid circuit board (11), respectively, with electrical connections between the rigid circuit board (11) and the respective flexible circuit board (14, 15), allowing electrical connections of the voltage reference circuit (12) to a desired electronic circuitry.

In an embodiment according to the second aspect of the invention, the rigid circuit board (11) comprises a ceramic material or a mixture of ceramic materials as its base material, wherein the ceramic materials are selected from a group of $Al_2O_3$ (alumina), SiC, BeO, AlN (aluminum nitride), $Si_3N_4$ (silicon nitride) and hybrid materials.

In an embodiment according to the second aspect of the invention, the first and second flexible circuit boards (14, 15) have lengths in the range of 5-15 mm.

In an embodiment according to the second aspect of the invention, the first and second flexible circuit boards (14, 15) are configured to be fixed to the rigid circuit board (11) by soldering.

In an embodiment according to the second aspect of the invention, mixing ratios of ingredients, which comprise a solder material, are configured to be adjusted.

In an embodiment according to the second aspect of the invention, the first flexible circuit board (14) and the second flexible circuit board (15) are both flexible flat cables.

According to a third aspect of the present invention, there is introduced a method for testing the circuit board arrangement (10) described in the first aspect and in any of its embodiments. The method for testing is characterized in that the method for testing comprises the steps of:
 connecting the circuit board arrangement (10) to a tester;

configuring the tester to trigger a measurement of an output reference voltage from the voltage reference circuit (12);

configuring the tester to trigger a check of operation for the temperature sensor (13); and if the measured output reference voltage stays within a predefined value range for that particular voltage reference circuit (12) and if the temperature sensor (13) is deemed to be operative:

outputting a positive result from the method for testing; and otherwise:

outputting a negative result from the method for testing.

In an embodiment according to the third aspect of the invention, the method for testing further comprises the step of:

the rigid circuit board (11) comprising a card-edge connector used for the connection to the tester.

In an embodiment according to the third aspect of the invention, the method for testing further comprises the step of:

the rigid circuit board (11) comprising a flex-connector used for the connection to the tester, where the flex-connector is soldered to the rigid circuit board (11).

In an embodiment according to the third aspect of the invention, the method for testing further comprises the steps of:

determining correction coefficients during the testing, concerning how the circuit board arrangement (10) behaves in different temperatures; and storing the correction coefficients in a database in a data table form.

DETAILED DESCRIPTION OF THE INVENTION

Figure 1:
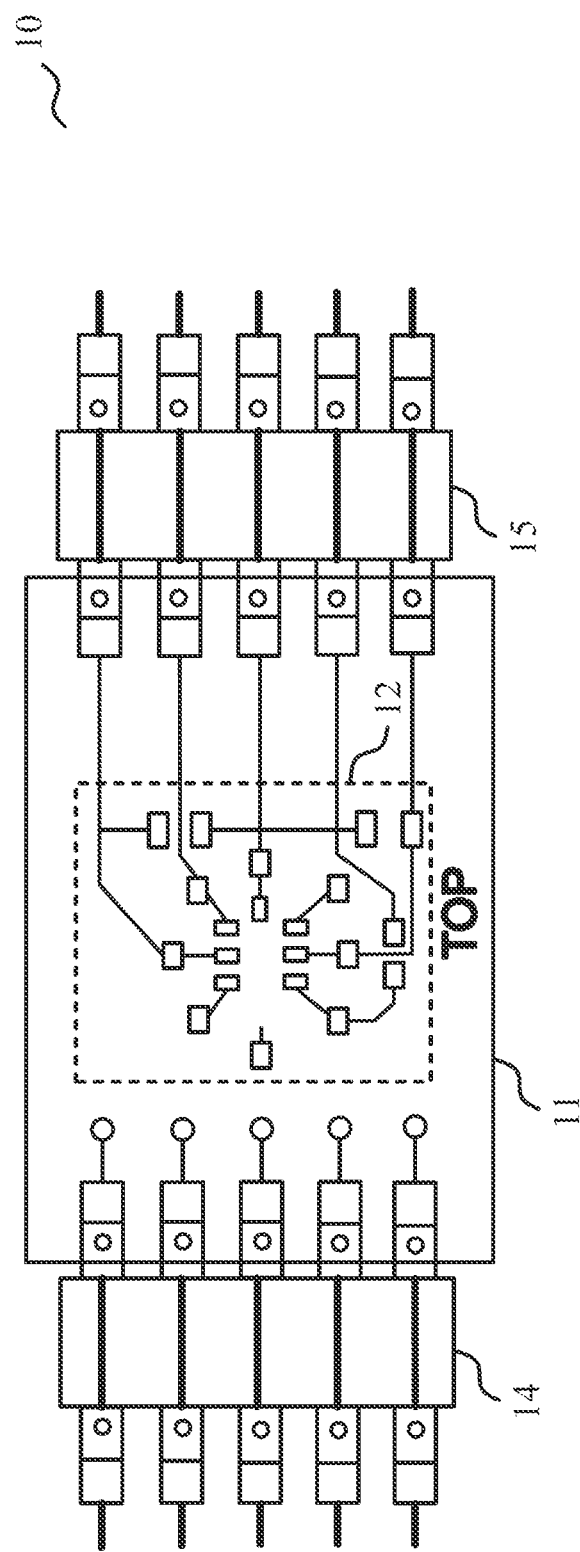
FIG. 1 shows an embodiment of a circuit board arrangement according to the present invention, with the top side shown to the viewer.

As stated above in the technical field of the invention, the present invention is related to accurate voltage references, and circuits providing accurate voltage references. The present invention is further related especially to circuit structures that are used in end devices applied in the field environment, where the environmental conditions like temperature and humidity may vary a lot compared to laboratory or office environments.

To be more precise, the change in temperature can be notably large, and this has a great effect in the created strains through expansions and retractions, especially where two materials are in contact which have notably different thermal expansion coefficients.

In brief, the present invention solves the above determined technical problem by introducing a double-sided circuit board where a first side of the circuit board comprises a voltage reference circuit, and a second side of the circuit board comprises a temperature sensor. The voltage reference circuit is generally very sensitive to external effects, such as temperature changes, and expanding or shrinking processes happening therefore in the applied materials. Also, other external forces, such as vibrations or sudden impulses may have a harmful effect on the accuracy of the output of the voltage reference circuit. The circuit board according to the invention is substantially a planar structure where the first and second sides of the planar circuit board locate on mutually opposite sides. The double-sided planar circuit board is essentially rigid in an embodiment of the present invention.

If the first side is defined to locate on an upper side of the circuit board (which is first placed along a horizontal plane or direction), then the upper side comprises the voltage reference circuit and the lower side comprises the temperature sensor. If the first side is defined to locate on a lower side of the circuit board, then the lower side comprises the voltage reference circuit and the upper side comprises the temperature sensor.

In an embodiment of the invention, the rigid and double-sided circuit board is designed to be manufactured from a ceramic base material. In another embodiment, the circuit board is designed to comprise at least two different ceramic base materials. The ceramic base material has a technical effect that the two-sided circuit board will then have good thermal conductivity, and thus, such a characteristic of the base material removes or at least notably decreases the possibility of creating large thermal differences along the surface of the rigid circuit board; even when a large thermal event is present (i.e. rapid heating or cooling) in the surroundings of the circuit board. When the thermal gradients are small across the circuit board, also the physical strain affecting the vulnerable circuit elements and sensors remains small. This ensures that the voltage reference circuit will continue to output accurate reference voltage values which stay within the desired specifications.

Examples of applicable ceramic materials comprise $Al_2O_3$ (alumina), SiC, BeO, AlN (aluminum nitride), $Si_3N_4$ (silicon nitride) and hybrid materials, in respective embodiments of the invention. The thermal expansion coefficient of the material is one relevant criterion, which makes these ceramic materials suitable for this purpose. For instance, $Al_2O_3$ (aluminium oxide or alumina) enables also good thermal conductivity, and thus, the use of alumina removes large thermal differences along the rigid circuit board, in case there is an increase in ambient temperature or other incoming thermal energy peak. In other words, the ceramic material will share the incoming thermal energy evenly along the surface of the circuit board so that there are not anymore any larger thermal gradients around the sensitive voltage reference circuit. This maintains the accuracy in the output of the voltage reference circuit. The appropriately selected material with suitable thermal expansion coefficient will ensure that the material will not break in case of varying temperatures along the circuit board.

The ceramic base material also makes the circuit board largely immune to effects of humidity. However, the mechanical stresses, impulses and strains may still affect such a circuit board involving a sensitive voltage reference circuit.

Temperature changes and especially their rapid change rates (i.e. larger derivatives of the temperature values as a function of time) are a main reason why a voltage reference circuit may start operating poorly i.e. giving inaccurate voltage values as their output. When temperatures change to a larger extent in a relatively quick manner, harmful mechanical stress (i.e. forces) is usually created affecting the sensitive circuitry and its circuit elements. The following solution and its various embodiments are designed to solve this technical problem, and the following sections describe it in more detail.

FIG. 1 shows an embodiment of a circuit board arrangement 10 according to the present invention, with a top side shown to the viewer.

The circuit board arrangement 10 according to the presented embodiment comprises a rigid circuit board 11. The rigid circuit board 11 is a planar and rectangular element manufactured from a suitable material capable to act as a base material for an electrical circuitry. The shape of the element is not that relevant, and of course, the rigid circuit board 11 may also be formed in a non-rectangular shape. In various embodiments of the invention, the rigid circuit board 11 is a double-sided element, where each of the planar sides may accommodate a certain functional entity or several entities per side.

In various embodiments of the invention, the rigid circuit board 11 is manufactured from a ceramic base material, as described above, with many variation possibilities as also discussed above.

In an embodiment, the first entity accommodating a first side of the rigid circuit board 11 is a voltage reference circuit 12. However, the first side of the rigid circuit board 11 may comprise also some other desired circuitry than just the voltage reference circuit 12. Examples of these other circuitries include high precision chip resistors, and other mechanically sensitive components or integrated circuits (IC:s).

Figure 2:
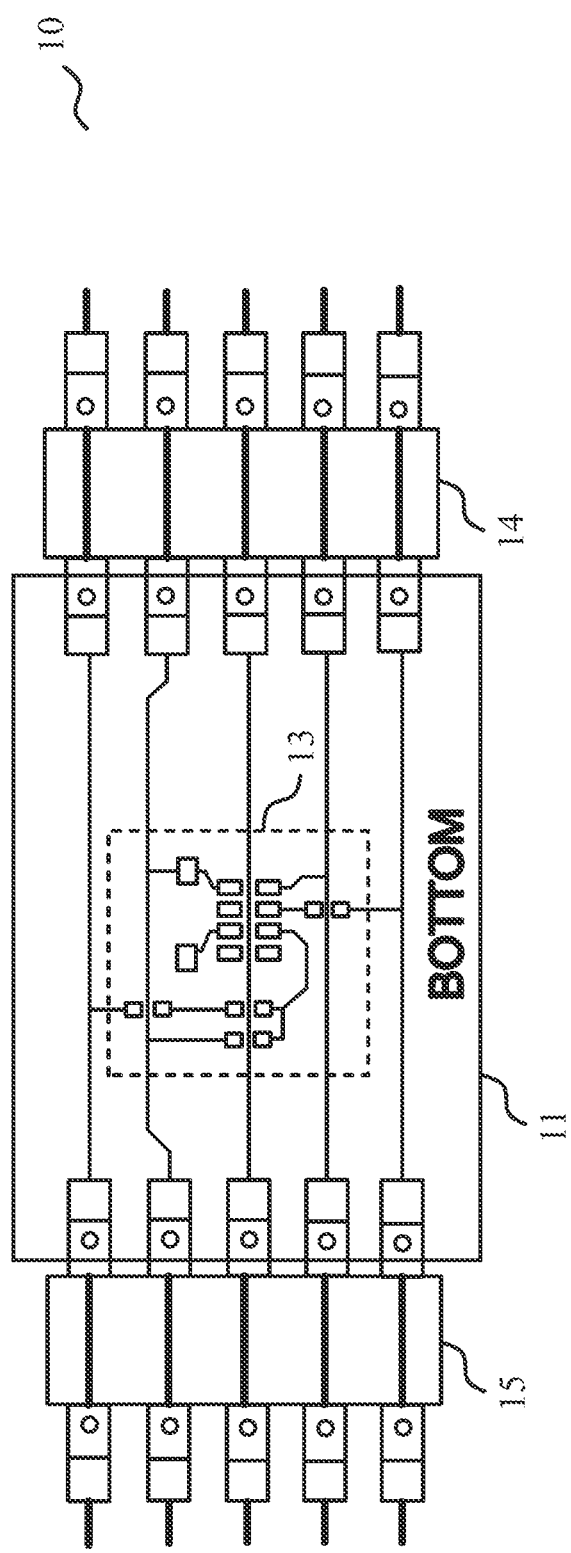
FIG. 2 shows an embodiment of the circuit structure with the bottom side shown.

FIG. 2 shows an embodiment of a circuit board arrangement 10 according to the present invention, with a bottom side shown to the viewer. In other words, FIG. 2 illustrates the opposite side of the circuit board 11 compared to what is visible in FIG. 1.

In an embodiment, the second entity accommodating a second side of the rigid circuit board 11 is a temperature sensor 13. However, the second side of the rigid circuit board 11 may comprise also some other desired circuitry than just the temperature sensor 13.

As it is clear from the double-sided planar circuit board arrangement 10 and its description above, the first and second entities locate on opposite sides of the rigid circuit board 11. Those entities do not have to locate on exactly matching positions (e.g. like centrally) on these opposite sides, but they may locate anywhere in the defined planar area of the rigid circuit board 11 along respective planar surfaces.

In the following, both FIGS. 1 and 2 are referred to.

As a functionally notable part of the present invention in this described embodiment, the circuit board arrangement 10 further comprises two flexible circuit boards 14, 15, connected to opposite edges of the rigid circuit board 11 (seen here along the left and right side edges of the rigid circuit board 11). The flexible circuit boards 14, 15 may be rather short, concerning their widths (as shown in FIGS. 1 and 2). In other words, their x-directional dimension (i.e. length) may be in a range of 5-15 mm, for instance. The structure means that the rigid circuit board 11 may be connected with flexible structures to the other parts of the used electronic circuitry. This covers both the input connection and the output connection of the rigid circuit board 11 comprising the voltage reference circuit 12 and the temperature sensor 13. The used electronic circuitry in this sense may comprise other parts required for various electronic measurements and signal processing, comprising other sensors and suitable electrical components, for instance.

In an embodiment of the invention, the flexible circuit boards 14, 15 are fixed to the rigid circuit board 11 by soldering. It is also possible to adjust mixing ratios of the ingredients which comprise the solder material. Furthermore, there is no specific need to clean up or wash the soldered areas. In this way, it is possible to minimize leakage currents as there is less moisture within the micro-cavities of the soldered areas themselves.

In an embodiment of the invention, a flexible flat cable may be used instead, in order to connect the rigid circuit board 11 to the other parts of the used electronic circuitry. Appropriate connectors are used in the interface of the flexible flat cable and rigid circuit board 11.

Yet one option is to use copper conductors or wirings and to weld them in correct locations in the input and output interfaces of the rigid circuit board 11.

As a result from the overall manufacturing process, no specific millings are required in the ceramic circuit board arrangement.

In the following, the testing scenarios of the finished product are discussed.

One option is to connect the rigid circuit board 11 to a tester by a card-edge connector directly. These connectors can be placed as one for the input and one for the output of the rigid circuit board 11.

Another option is to solder a flex-connector to the ceramic rigid circuit board 11, respectively to the input and output interfaces of the rigid circuit board 11.

When the test arrangement is ready and the circuit board arrangement 10 according to the invention is connected to the tester, there is just a need to measure the voltage reference value and to ensure that the temperature sensor 13 functions properly, in an embodiment of the invention.

If there is a larger measurement system in which the voltage reference circuit 12 is one part of, it is reasonable to test the system is in smaller parts before the whole system is assembled. It is also important to test the voltage reference circuit 12 in a way where no mechanical strains are created because of the testing itself.

It is possible to test just the functionality of the voltage reference circuit 12. However, in another embodiment, it is possible to test the circuit in a more broadly defined fashion. This means that it is possible to determine correction coefficients during the testing, concerning how the circuit board arrangement 10 behaves in different temperatures. The correction coefficients may be stored in an appropriate database in a data table form, for instance.

As a result, with the circuit board arrangement 10 of the present invention and the testing principle described above, it is possible to change the thermal behavior of the voltage reference circuit 12 to a linearly acting component. The end result would be that the voltage reference circuit 12 would act even better than what the manufacturer of the voltage reference circuit 12 has guaranteed in their specifications. This is a notable advantage of the created circuit board arrangement 10.

The technical effect of the present invention is that the ceramic rigid circuit board 11 material is able to smoothen or flatten the temperatures so that there does not emerge any notable temperature gradients around the sensitive voltage reference circuit 12. Additionally, any possible mechanical strains or vibrations are also handled in a way that they do not affect the accuracy of the voltage reference circuit 12.

The end result is, in other words: There do not exist any notable temperature gradients in the area of the voltage reference circuit 12. This is true no matter how the ambient temperature will behave over time. This results in obtaining accurate voltage reference values consistently in various different usage situations and environmental situations. In other words, the present invention introduces a circuit board arrangement 10 comprising a voltage reference functionality tolerating notable ambient temperature changes without any notable decrease in accuracy.

The present invention is not restricted to embodiments discussed above but the present invention may vary within the scope of the claims.

The invention claimed is:

1. A circuit board arrangement, the circuit board arrangement comprising:
   a first planar side of a rigid circuit board comprising a voltage reference circuit;
   a second planar side of the rigid circuit board comprising a temperature sensor;
   wherein the first and second planar sides locate on opposite surfaces of the rigid circuit board;
   a first flexible circuit board and a second flexible circuit board connected to opposite edges of the rigid circuit board, respectively, with electrical connections between the rigid circuit board and the respective flexible circuit board, enabling electrical connections of the voltage reference circuit to a desired electronic circuitry.

2. The circuit board arrangement according to claim 1, wherein the rigid circuit board comprises a ceramic material or a mixture of ceramic materials as a base material of the rigid circuit board, wherein the ceramic materials are selected from a group of $Al_2O_3$ (alumina), SiC, BeO, AlN (aluminum nitride), SiaN4 (silicon nitride) and hybrid materials.

3. The circuit board arrangement according to claim 1, wherein the first and second flexible circuit boards have lengths in the range of 5-15 mm.

4. The circuit board arrangement according to claim 1, wherein the first and second flexible circuit boards are soldered to the rigid circuit board.

5. The circuit board arrangement according to claim 1, wherein mixing ratios of ingredients, which comprise a solder material, are configured to be adjusted.

6. The circuit board arrangement according to claim 1, wherein the first flexible circuit board and the second flexible circuit board are both flexible flat cables.

7. A method for manufacturing a circuit board arrangement, wherein the method for manufacturing comprises the steps of:
   manufacturing a rigid circuit board, which comprises a voltage reference circuit on a first planar side of the rigid circuit board, and a temperature sensor on a second planar side of the rigid circuit board, wherein the first and second planar sides locate on opposite surfaces of the rigid circuit board;
   installing a first flexible circuit board and a second flexible circuit board connected to opposite edges of the rigid circuit board, respectively, with electrical connections between the rigid circuit board and the respective flexible circuit board, enabling electrical connections of the voltage reference circuit to a desired electronic circuitry.

8. The method for manufacturing according to claim 7, wherein the rigid circuit board comprises a ceramic material or a mixture of ceramic materials as a base material of the rigid circuit board, wherein the ceramic materials are selected from a group of $Al_2O_3$ (alumina), SiC, BeO, AlN (aluminum nitride), $Si_3N_4$ (silicon nitride) and hybrid materials.

9. The method for manufacturing according to claim 7, wherein the first and second flexible circuit boards have lengths in the range of 5-15 mm.

10. The method for manufacturing according to claim 7, comprising soldering the first and second flexible circuit boards to the rigid circuit board.

11. The method for manufacturing according to claim 7, wherein mixing ratios of ingredients, which comprise a solder material, are configured to be adjusted.

12. The method for manufacturing according to claim 7, wherein the first flexible circuit board and the second flexible circuit board are both flexible flat cables.

13. A method for testing the circuit board arrangement according to claim 1, wherein the method for testing comprises the steps of:
   connecting the circuit board arrangement to a tester;
   configuring the tester to trigger a measurement of an output reference voltage from the voltage reference circuit;
   configuring the tester to trigger a check of operation for the temperature sensor; and if the measured output reference voltage stays within a predefined value range for the voltage reference circuit and if the temperature sensor is deemed to be operative:
   outputting a positive result from the method for testing; and otherwise:
   outputting a negative result from the method for testing.

14. The method for testing according to claim 13, comprising using the rigid circuit board comprising a card-edge connector for connecting to the tester.

15. The method for testing according to claim 13, the rigid circuit board comprising a flex-connector;
   using the flex connector for connecting to the tester, where the flex-connector is soldered to the rigid circuit board.

16. The method for testing according to claim 13, wherein the method for testing further comprises the steps of:
   determining correction coefficients during the testing, concerning how the circuit board arrangement behaves in different temperatures; and
   storing the correction coefficients in a database in a data table form.

* * * * *